US008886507B2

(12) United States Patent
Sharma et al.

(10) Patent No.: US 8,886,507 B2
(45) Date of Patent: Nov. 11, 2014

(54) METHODS AND SYSTEMS FOR SIMULATING CIRCUIT OPERATION

(75) Inventors: Prashant Sharma, Cumming, GA (US); Jia Qiang Ma, Hollywood, FL (US)

(73) Assignee: General Electric Company, Schenectady, NY (US)

(*) Notice: Subject to any disclaimer, the term of this patent is extended or adjusted under 35 U.S.C. 154(b) by 541 days.

(21) Appl. No.: 13/182,079

(22) Filed: Jul. 13, 2011

(65) Prior Publication Data

US 2013/0018643 A1  Jan. 17, 2013

(51) Int. Cl.
| G06F 17/50 | (2006.01) |
| G06G 7/62 | (2006.01) |
| G06F 17/00 | (2006.01) |
| G01R 31/3183 | (2006.01) |
| G06F 11/26 | (2006.01) |

(52) U.S. Cl.
CPC ............ G06F 17/5022 (2013.01); G06F 17/00 (2013.01); G01R 31/318357 (2013.01); G01R 31/318342 (2013.01); G06F 17/5045 (2013.01); G06F 11/26 (2013.01); G06F 17/5009 (2013.01); G06F 17/5036 (2013.01)
USPC ................................. 703/14; 703/16; 703/17

(58) Field of Classification Search
CPC ......... G06F 17/50; G06F 17/36; G06F 17/22; G06F 17/45; G06F 17/00; G06F 17/5009; G06F 17/5045; G06F 11/26; G06R 31/318357; G06R 31/318342
USPC .............................................. 703/14, 17, 16
See application file for complete search history.

(56) References Cited

U.S. PATENT DOCUMENTS

| 5,220,512 | A | 6/1993 | Watkins et al. |
| 5,867,399 | A | 2/1999 | Rostoker et al. |
| 5,872,952 | A * | 2/1999 | Tuan et al. ..................... 714/724 |
| 6,009,249 | A * | 12/1999 | Weber ............................ 716/103 |
| 6,461,882 | B2 | 10/2002 | Ishida et al. |
| 6,530,065 | B1 | 3/2003 | McDonald et al. |
| 6,546,536 | B1 | 4/2003 | Nolan |
| 6,832,182 | B1 | 12/2004 | Wilson, Jr. |
| 7,574,342 | B2 | 8/2009 | Kundert |
| 7,681,156 | B2 | 3/2010 | Suwada et al. |
| 7,698,677 | B2 * | 4/2010 | Zhao et al. ..................... 716/122 |
| 8,667,455 | B1 * | 3/2014 | Ho ................................. 716/139 |
| 2003/0182639 | A1 | 9/2003 | Lehner et al. |
| 2004/0030999 | A1 | 2/2004 | Ng et al. |
| 2006/0236303 | A1 | 10/2006 | Wilson, Jr. et al. |
| 2007/0083351 | A1 | 4/2007 | Van Assche et al. |

OTHER PUBLICATIONS

Mainak Banga, NPL, "A region based approach for the identification of Hardware trojans", 2008.*
Irith Pomeranz, NPL, "On the feasibility of fault simulation using partial circuit descriptions", IEEE 2000.*
Search Report and Written Opinion from corresponding EP Application No. 12175693.6 dated Nov. 15, 2012.

* cited by examiner

Primary Examiner — Omar Fernandez Rivas
Assistant Examiner — Angel Calle
(74) Attorney, Agent, or Firm — Armstrong Teasdale LLP

(57) ABSTRACT

A processor for use in simulating operation of a portion of an electrical circuit is provided. The processor is configured to receive at least one input indicative of electrical circuit data related to the electrical circuit being simulated, generate a model of the electrical circuit based on the at least one input, receive a user input that indicates the portion of the electrical circuit to be simulated, generate, based on the user input and the electrical circuit model, a partial circuit snapshot that corresponds to the portion of the electrical circuit, and apply at least one event to the partial circuit snapshot to simulate operation of the corresponding portion of the electrical circuit.

17 Claims, 5 Drawing Sheets

METHODS AND SYSTEMS FOR SIMULATING CIRCUIT OPERATION

BACKGROUND OF THE INVENTION

The subject matter disclosed herein relates generally to electrical circuits, and more specifically, to methods and systems for use in simulating operation of electrical circuits.

Electrical circuits are used in numerous applications, including power distribution systems and electronic devices. In complex systems and/or devices, the number of components included in electrical circuits and the complexity of connections between those components may be so numerous and/or so complicated that it may be difficult if not impossible to analyze and/or diagnose such circuits by human operators. Accordingly, in some applications, circuit simulators may be used to simulate the operation of such electrical circuits.

Although some known circuit simulators allow the simulation of the operation of electrical circuits, within some electrical circuits, it may still be difficult to isolate and/or stimulate discrete portions of the circuit using known circuit simulators. For example, at least some known circuit simulators do not enable users to isolate and perform simulations and/or studies on smaller portions of complex electric circuits. As such, for such circuits, users may be unable to understand how the complex electric circuit operates and/or how local changes in portions of the electric circuit effect operation of the overall electric circuit. Furthermore, at least some known circuit simulators only accept inputs in limited data formats.

BRIEF DESCRIPTION OF THE INVENTION

In one aspect, a processor for use in simulating operation of a portion of an electrical circuit is provided. The processor is configured to receive at least one input indicative of electrical circuit data related to the electrical circuit being simulated, generate a model of the electrical circuit based on the at least one input, receive a user input that indicates the portion of the electrical circuit to be simulated, generate, based on the user input and the electrical circuit model, a partial circuit snapshot that corresponds to the portion of the electrical circuit, and apply at least one event to the partial circuit snapshot to simulate operation of the corresponding portion of the electrical circuit.

In another aspect, a circuit simulator for simulating operation of a portion of an electrical circuit is provided. The circuit simulator includes a memory device, a user input interface, and a processor coupled to the memory device and the user input interface. The processor is configured to receive at least one input indicative of electrical circuit data related to the electrical circuit being simulated, generate a model of the electrical circuit based on the at least one input, store the electrical circuit model on the memory device, receive, from the user input interface, a user input that indicates the portion of the electrical circuit to be simulated, generate, based on the user input and the electrical circuit model, a partial circuit snapshot that corresponds to the portion of the electrical circuit, and apply at least one event to the partial circuit snapshot to simulate operation of the corresponding portion of the electrical circuit.

In yet another aspect, a method for simulating operation of at least a portion of an electrical circuit is provided. The method includes receiving, at a processing device, at least one input indicative of electrical circuit data related to the electrical circuit being simulated, generating a model of the electrical circuit based on the at least one input, receiving, at the processing device, a user input that indicates the portion of the electrical circuit to be simulated, generating, based on the user input and the generated electrical circuit model, a partial circuit snapshot that corresponds to the portion of the electrical circuit, and applying at least one event to the partial circuit snapshot to simulate operation of the corresponding portion of the electrical circuit.

DETAILED DESCRIPTION OF THE INVENTION

The methods and systems described herein enable simulation of the operation of a portion of an electrical circuit. A circuit simulator described herein generates a model of an electrical circuit from circuit component data, circuit mapping data, and event data. Based on the generated circuit model and user inputs, the circuit simulator generates a partial circuit snapshot of the circuit model that corresponds to the portion of the electrical circuit. The circuit simulator applies one or more events from the event data to the partial circuit snapshot to simulate operation of the corresponding portion of the electrical circuit. The circuit simulator also generates and displays a graphical circuit representation of the partial circuit snapshot.

Technical effects of the methods and systems described herein include at least one of: (a) receiving, at a processing device, at least one input indicative of electrical circuit data related to the electrical circuit being simulated; (b) generating a model of the electrical circuit based on the at least one input; (c) receiving, at the processing device, a user input that indicates the portion of the electrical circuit to be simulated; (d) generating, based on the user input and the generated electrical circuit model, a partial circuit snapshot that corresponds to the portion of the electrical circuit; and (e) applying at least one event to the partial circuit snapshot to simulate operation of the corresponding portion of the electrical circuit.

Figure 1:
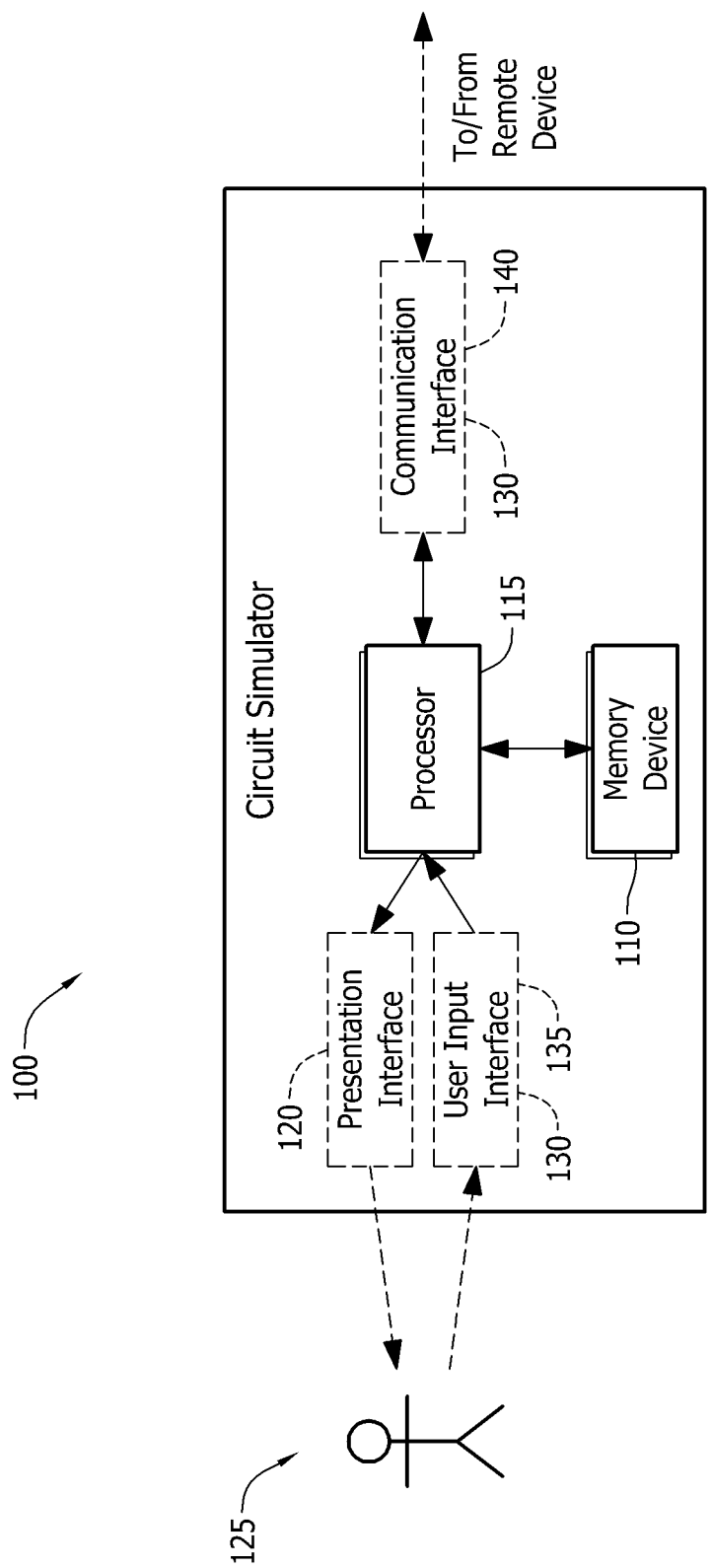
FIG. 1 is a block diagram of an exemplary circuit simulator.

FIG. 1 is a block diagram of an exemplary circuit simulator 100 for use in simulating an electrical circuit, as described in detail herein. Circuit simulator 100 includes a memory device 110 and a processor 115 that is coupled to memory device 110 for executing instructions. In some embodiments, executable instructions are stored in memory device 110. Circuit simulator 100 performs one or more operations described herein by programming processor 115. For example, processor 115 may be programmed by encoding an operation as one or more executable instructions and by providing the executable instructions in memory device 110. Processor 115 may include one or more processing units (e.g., in a multi-core configuration).

In the exemplary embodiment, memory device 110 is one or more devices that enable information such as executable instructions and/or other data to be stored and retrieved.

Memory device 110 may include one or more computer readable media, such as, without limitation, dynamic random access memory (DRAM), static random access memory (SRAM), a solid state disk, and/or a hard disk. Memory device 110 may be configured to store, without limitation, application source code, application object code, source code portions of interest, object code portions of interest, configuration data, execution events and/or any other type of data.

In some embodiments, circuit simulator 100 includes a presentation interface 120 that is coupled to processor 115. Presentation interface 120 presents information, such as application source code and/or execution events, to a user 125. For example, presentation interface 120 may include a display adapter (not shown) that may be coupled to a display device, such as a cathode ray tube (CRT), a liquid crystal display (LCD), an organic LED (OLED) display, and/or an "electronic ink" display. In some embodiments, presentation interface 120 includes one or more display devices.

In some embodiments, circuit simulator 100 includes an input interface 130, such as a user input interface 135 and/or a communication interface 140. In the exemplary embodiment, user input interface 135 is coupled to processor 115 and receives input from user 125. User input interface 135 may include, for example, a keyboard, a pointing device, a mouse, a stylus, a touch sensitive panel (e.g., a touch pad or a touch screen), a gyroscope, an accelerometer, a position detector, and/or an audio user input interface. A single component, such as a touch screen, may function as both a display device of presentation interface 120 and user input interface 135. User input interface 135 may include, among other possibilities, a web browser and/or a client application. Web browsers and client applications enable users, such as user 125, to display and interact with media and other information from a remote device.

In the exemplary embodiment, communication interface 140 is coupled to processor 115. Moreover, communication interface 140 is configured to couple in communication with one or more remote devices. For example, communication interface 140 may include, without limitation, a wired network adapter, a wireless network adapter, and/or a mobile telecommunications adapter. Communication interface 140 may also transmit data to one or more remote devices.

Figure 2:
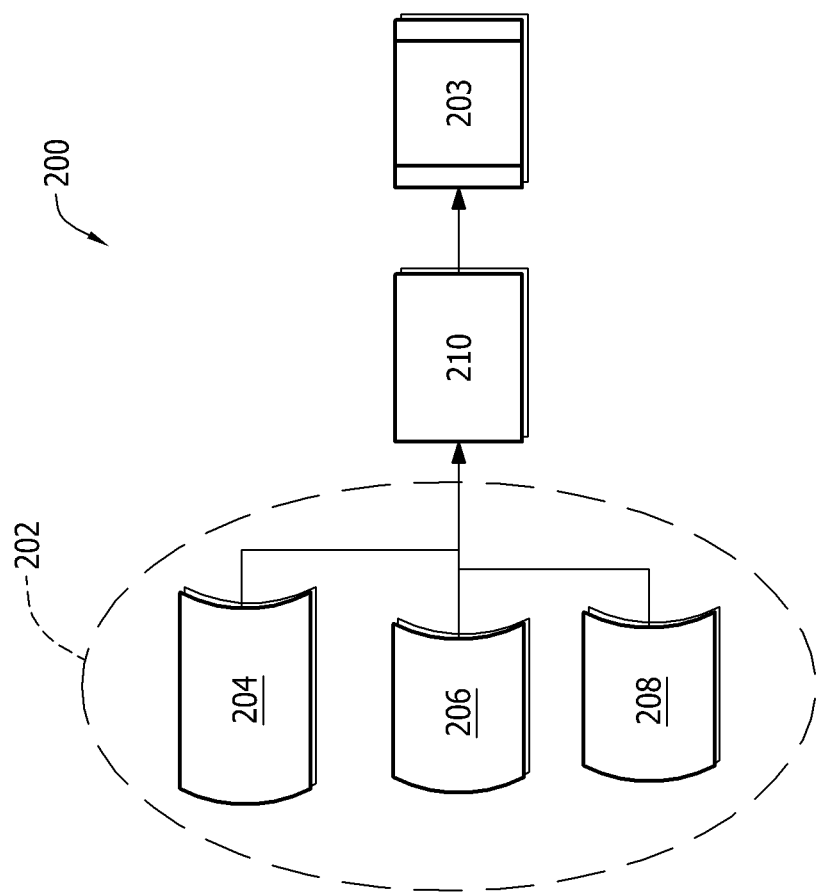
FIG. 2 is an exemplary flow diagram for use in creating a model of an electrical circuit using the circuit simulator shown in FIG. 1.

FIG. 2 is an exemplary flow diagram 200 that may be used to create a model of an electrical circuit using circuit simulator 100 (shown in FIG. 1). In the exemplary embodiment, processor 115 receives inputs 202 to generate a model circuit 203, as described in detail herein. In the exemplary embodiment, inputs 202 are provided to the processor 115 by a user utilizing user input interface 135 (shown in FIG. 1). In some embodiments, received inputs 202 are stored on memory device 110 (shown in FIG. 1).

Inputs 202 contain electrical circuit data related to the electrical circuit (not shown) that is to be modeled. In the exemplary embodiment, the electrical circuit to be modeled is an electrical power distribution system circuit. Alternatively, the electrical circuit to be modeled may be any circuit that enables circuit simulator 100 (shown in FIG. 1) to function as described herein. In the exemplary embodiment, inputs 202 include circuit component data 204, circuit mapping data 206, and event data 208. Circuit component data 204, circuit mapping data 206, and event data 208 may be provided to circuit simulator 100 in a wide variety of custom data formats. For example, in one embodiment, circuit component data 204, circuit mapping data 206, and/or event data 208 are provided to circuit simulator 100 in a common information model (CIM) standard, such as CIM Version 2.14.

Circuit component data 204 includes the components to be included in model circuit 203 and their corresponding characteristics. For example, components may include resistors, thyristors, capacitors, inductors, transistors, batteries, alternating current (AC) and direct current (DC) voltage sources, switches, transformers, operational amplifiers, reclosers, feeders, breakers, and/or logic gates. Exemplary characteristics of the components may include a resistance, a capacitance, an inductance, a number of inputs, an operational voltage rating, and/or a power output. Alternatively, circuit component data 204 may include any components and/or characteristics that enable circuit simulator 100 to function as described herein.

Circuit mapping data 206 includes the connections between components in model circuit 203. In the exemplary embodiment, circuit mapping data 206 specifies connections between the components in circuit component data 204. For example, circuit mapping data 206 may specify that an input of one circuit component is electrically coupled to an output of another circuit component. By altering circuit mapping data 206, users can vary the design and/or configuration of the electrical circuit to be modeled.

Event data 208 includes one or more conditions and/or events to be applied to circuit model 203 for studies and/or simulations. More specifically, event data 208 includes circuit input variables that are used when simulating operation of the electrical circuit. For example, event data 208 may include a voltage and/or current to apply to model circuit 203 to simulate operation of the corresponding electrical circuit. Further, event data 208 may include a fault analysis and/or power distribution analysis of model circuit 203. Alternatively, event data 208 may include any operational conditions and/or events to be simulated that enable circuit simulator 100 to function as described herein. In some embodiments, event data 208 includes historical circuit data. More specifically, event data 208 includes circuit input variables measured from actual electrical circuits. The historical circuit data may be stored, for example, on memory device 110 (shown in FIG. 1). As described herein, after the conditions and/or events are applied (i.e., simulated) to model circuit 203, circuit simulator 100 calculates various properties of model circuit 203. For example, circuit simulator 100 may calculate a load distribution and/or power flow in model circuit 203. Alternatively, circuit simulator 100 may calculate any properties of model circuit 203 that enable circuit simulator 100 to function as described herein.

In the exemplary embodiment, user 125 (shown in FIG. 1) enters circuit component data 204, circuit mapping data 206, and/or event data 208 using user input interface 135 and/or communication interface 140 (both shown in FIG. 1). In some embodiments, user 125 inputs circuit component data 204, circuit mapping data 206, and/or event data 208 using a web-based application. That is, the user can enter circuit component data 204, circuit mapping data 206, and event data 208 by accessing circuit simulator 100 through a web-browser via, for example, communication interface 140. Alternatively, circuit component data 204, circuit mapping data 206, and/or event data 208 may be input using any suitable method. For example, in some embodiments, processor 115 reads in values for circuit component data 204, circuit mapping data 206, and/or event data 208 from a data spreadsheet, converts the values into memory objects, and stores the memory objects in memory device 110.

Processor 115 receives inputs 202, including circuit component data 204, circuit mapping data 206, and event data 208. In the exemplary embodiment, processor 115 includes a data transformer 210 configured to convert an input format of circuit component data 204, circuit mapping data 206, and/or event data 208. Accordingly, depending on the input format of circuit component data 204, circuit mapping data 206, and/or event data 208, data transformer 210 converts the input format of circuit component data 204, circuit mapping data 206, and event data 208 to a universal format. For example, in one embodiment, circuit component data 204, circuit mapping data 206, and/or event data 208 are converted to a common information model (CIM) standard. Alternatively, data transformer 210 converts circuit component data 204, circuit mapping data 206, and/or event data 208 into any format that enables circuit simulator 100 to function as described herein.

From circuit component data 204, circuit mapping data 206, and event data 208, processor 115 generates model circuit 203. That is, model circuit 203 includes the components defined in circuit component data 204 connected as defined in circuit mapping data 206. Further, the one or more events defined in event data 208 are attached to model circuit 203, such that the one or more events in event data 208 can be simulated in model circuit 203 and/or a portion of model circuit 203, as described in detail below.

Figure 3:
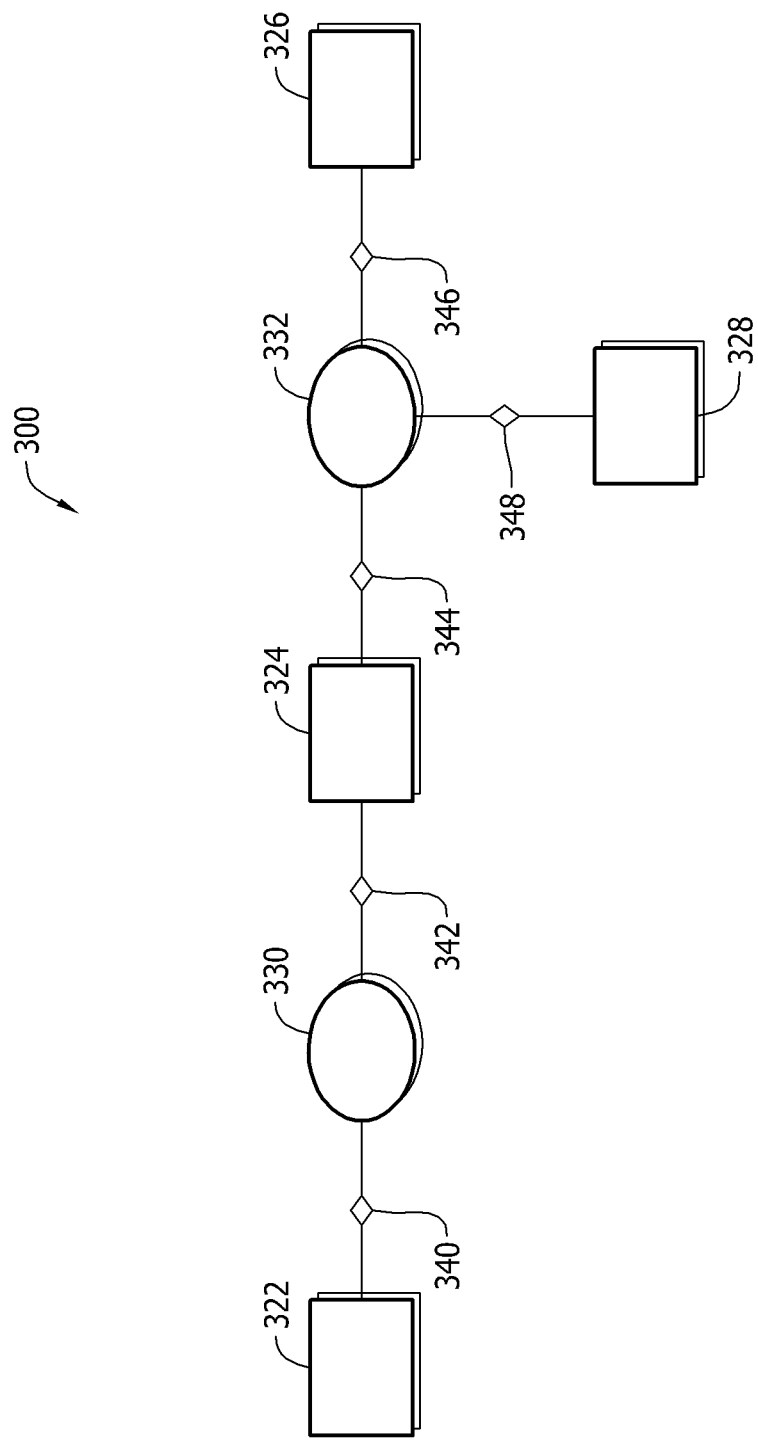
FIG. 3 is a schematic diagram of an exemplary model circuit that may be generated using the circuit simulator shown in FIG. 1.

FIG. 3 is a schematic diagram of an exemplary model circuit 300 that may be generated from circuit component data 204 and circuit mapping data 206, such as model circuit 203 (shown in FIG. 2). Model circuit 300 includes a first switch 322, a second switch 324, a third switch 326, and a fourth switch 328. Model circuit 300 also includes a first node 330 and second node 332. In the exemplary embodiment, switches 322, 324, 326, and 328, and nodes 330 and 332 are defined in circuit component data 204. Further, electrical connections between switches 322, 324, 326, and 328, and nodes 330 and 332 are defined in circuit mapping data 206. For example, circuit mapping data 206 specifies that first node 330 is electrically coupled to first switch 322 at a first terminal 340 and electrically coupled to second switch 324 at a second terminal 342. Additionally, in the exemplary embodiment, circuit mapping data 206 specifies that second node 332 is electrically coupled to second switch 324 at a third terminal 344, electrically coupled to third switch 326 at a fourth terminal 346, and electrically coupled to fourth switch 328 at a fifth terminal 348.

Figure 4:
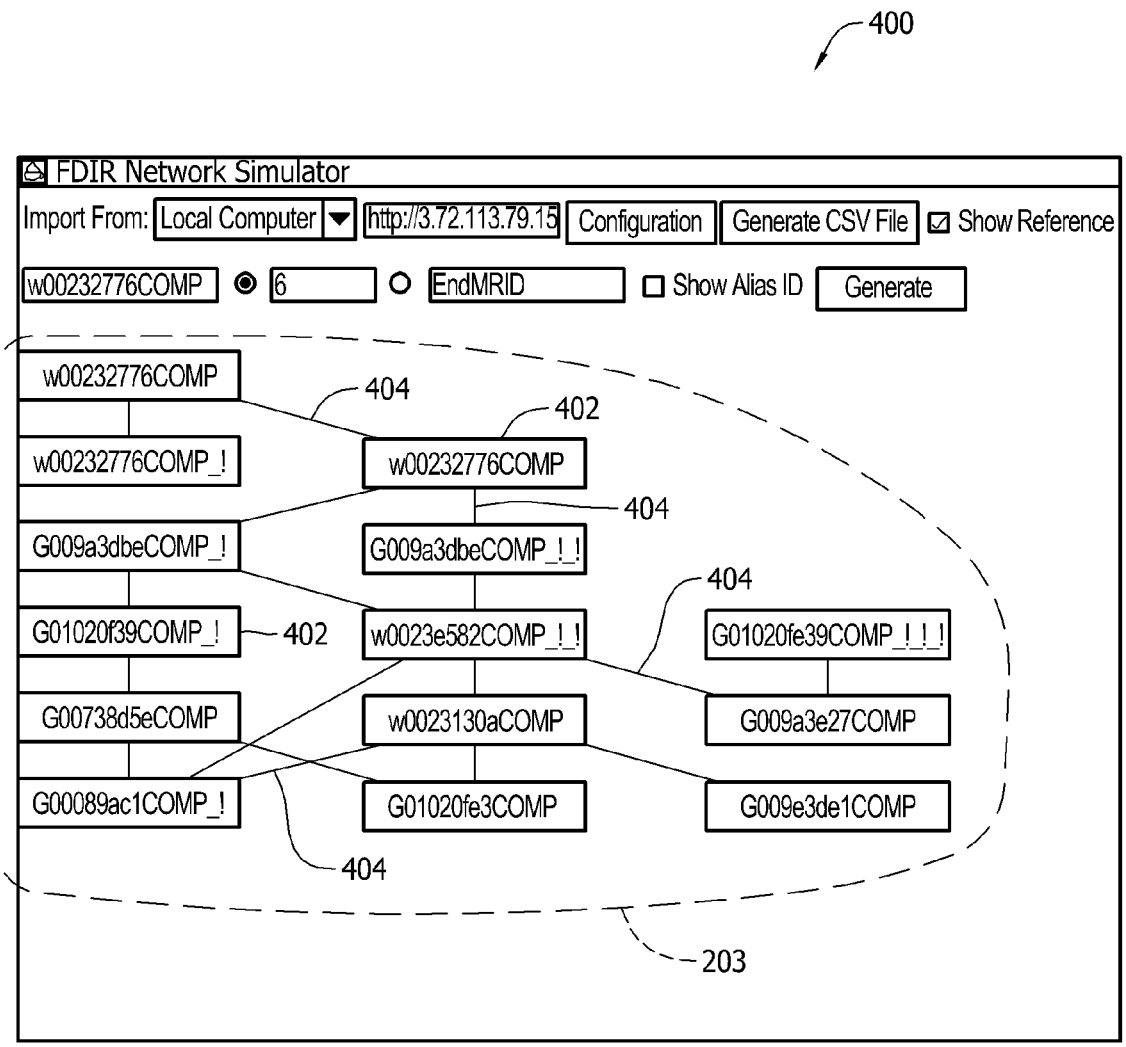
FIG. 4 is a screenshot of an exemplary presentation interface that may be generated using the circuit simulator shown in FIG. 1.

FIG. 4 is an exemplary screenshot 400 of an exemplary interface, such as presentation interface 120 (shown in FIG. 1). Screenshot 400 displays model circuit 203 as a plurality of circuit component blocks 402 and links 404 indicating connections between circuit component blocks 402. Each circuit component block 402 of model circuit 203 may include a single component (e.g., switches 322, 324, 326, and 328), or may be a circuit that forms a portion of model circuit 203. For example, circuit component block 402 could include all of model circuit 300 (shown in FIG. 3) as part of a larger model circuit.

Further, using user input interface 135 (shown in FIG. 1), a user can select the entire model circuit 203 for simulation, or select a subsection, or partial circuit snapshot, of model circuit 203 for simulation. As used here, a partial circuit snapshot refers to a portion of model circuit 203 that corresponds to a portion of the electrical circuit represented by model circuit 203. For example, in one embodiment, a user can select a partial circuit snapshot of model circuit 203 by selecting one of circuit component blocks 402. A user may also select a partial circuit snapshot that includes a plurality of circuit component blocks 402 by creating and dragging a selection box over the desired circuit component blocks 402 using, for example, a mouse. Accordingly, using the methods and systems described herein, the operation of smaller circuits contained within a larger, more complex electrical circuit can be simulated.

After model circuit 203 has been generated by circuit simulator 100, studies and/or simulations can be carried out on model circuit 203. That is, the one or more events in event data 208 are applied to model circuit 203 to simulate operation of model circuit 203 as specified in event data 208. In some embodiments, event data 208 includes a fault analysis of model circuit 203 that determines the location of faults in model circuit 203. In other embodiments, event data 208 includes a power distribution analysis of model circuit 203 that determines a power utilization and/or power distribution between components of model circuit 203. Alternatively, event data 208 may include any simulation and/or study that enables circuit simulator 100 to function as described herein.

Figure 5:
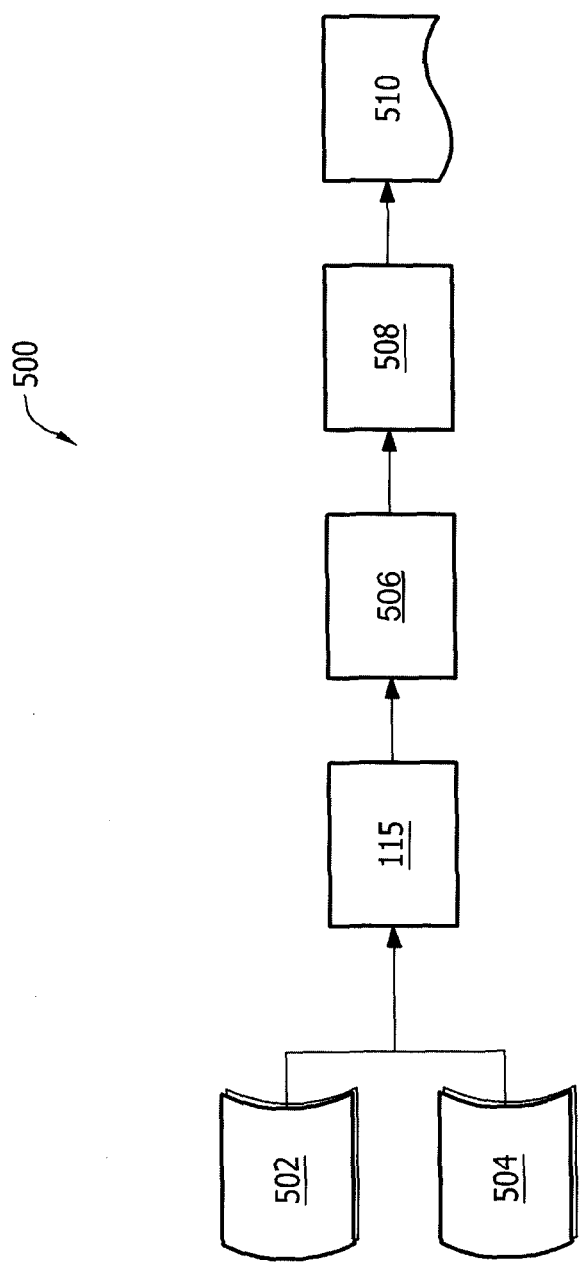
FIG. 5 is an exemplary flow diagram for use in simulating operation of a portion of an electrical circuit using the circuit simulator shown in FIG. 1.

FIG. 5 is an exemplary flow diagram 500 for use in simulating operation of portion of an electrical circuit using circuit simulator 100 (shown in FIG. 1). As described above, circuit simulator 100 generates a model circuit 502. User 125 (shown in FIG. 1) provides one or more user inputs 504 at user input interface 135 (shown in FIG. 1). In the exemplary embodiment, user input 504 specifies which part of a model circuit 502 is to be simulated. That is, user input 504 specifies which components of model circuit 502 should be included in a partial circuit snapshot 506.

Processor 115 receives the user input 504 from user input interface 135 and retrieves model circuit 502. In the exemplary embodiment, model circuit 502 is stored on memory device 110 (shown in FIG. 1) and is retrieved from memory device 110 by processor 115. From model circuit 502 and user input 504, processor 115 generates partial circuit snapshot 506. In the exemplary embodiment, partial circuit snapshot 506 is stored on memory device 110.

Once processor 115 generates partial circuit snapshot 506, processor 115 applies one or more events 508 from event data 208 (shown in FIG. 1) to partial circuit snapshot 506. As explained above, events 508 may include a fault analysis, a power distribution analysis, and/or any simulation that may be performed on partial circuit snapshot 506.

In the exemplary embodiment, after one or more events 508 are applied to partial circuit snapshot 506, processor 115 displays the partial circuit snapshot 506 on presentation interface 120 (shown in FIG. 1) as a graphical circuit representation 510. Graphical circuit representation 510 includes components in partial circuit snapshot 506 and connections between those components. In some embodiments, graphical circuit representation 510 includes a plurality of circuit component blocks 402 and links 404, similar to those shown in FIG. 4. In other embodiments, graphical circuit representation 510 includes a schematic circuit diagram of partial circuit snapshot 506, similar to that shown in FIG. 3.

In the exemplary embodiment, graphical circuit representation 510 includes an updated state of each component in partial circuit snapshot 506 after application of one or more events 508. In one embodiment, after performing a fault analysis, graphical circuit representation 510 includes markers that identify the location of faults within partial circuit snapshot 506. Further, in another embodiment, after performing a power distribution analysis, graphical circuit representation 510 includes information indicating how power is distributed across partial circuit snapshot 506, such as a load distribution and/or a power flow for components in partial circuit snapshot 506. Alternatively, graphical circuit representation 510 may indicate any state and/or characteristic of partial circuit snapshot 506 and/or components of partial circuit snapshot. For example, graphical circuit representation 510 may highlight and/or mark any components of partial circuit snapshot 506 that failed, malfunctioned, and/or were damaged during application of one or more events 508.

As compared to known circuit simulators, the methods and systems described herein enable a user to select and isolate a portion of a larger, more complex circuit, and perform various simulations and/or studies on the selected portion as compared to circuit simulators that do not permit a user to isolate discrete sections of a circuit. Isolating and analyzing portions of a larger circuit facilitates enabling users to understand the effects of local changes on the overall electrical circuit, and facilitates optimizing design of the overall electrical circuit with a better certainty as compared to circuit simulators in which only the overall circuit can be analyzed. Further, as compared to known circuit simulators, using the methods and systems described herein, users can input information in a variety of custom data formats. Finally, by simulating electrical circuits using the methods and systems described herein, as compared to known circuit simulators, users can better identify faults in electrical circuits, understand the operation of new components in electrical circuits, improve response times to changes in electrical circuits, and improve restoration of electrical circuits in the event of faults.

The embodiments described herein enable simulation of the operation of a portion of an electrical circuit. A circuit simulator described herein generates a model of an electrical circuit from circuit component data, circuit mapping data, and event data. Based on the generated circuit model and user inputs, the circuit simulator generates a partial circuit snapshot of the circuit model that corresponds to the portion of the electrical circuit. The circuit simulator applies one or more events from the event data to the partial circuit snapshot to simulate operation of the corresponding portion of the electrical circuit. The circuit simulator also generates and displays a graphical circuit representation of the partial circuit snapshot.

Exemplary embodiments of systems and methods for simulating operation of a portion of an electrical circuit are described herein. The methods and systems described herein are not limited to the specific embodiments described herein, but rather, components of the systems and/or steps of the methods may be utilized independently and separately from other components and/or steps described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A processor for use in simulating operation of a portion of an electrical circuit, said processor configured to:
receive at least one input indicative of electrical circuit data related to the electrical circuit being simulated;
generate a model of the electrical circuit based on the at least one input;
receive a user input that indicates the portion of the electrical circuit to be simulated;
generate, based on the user input and the electrical circuit model, a partial circuit snapshot that corresponds to the portion of the electrical circuit represented by the model of the electrical circuit;
generate a graphical circuit representation of the partial circuit snapshot;
display the graphical circuit representation on a presentation interface; and
apply at least one event to the partial circuit snapshot to:
simulate operation of the corresponding portion of the electrical circuit; and
perform a fault analysis on the partial circuit snapshot to identify at least one component within the partial circuit snapshot that unintentionally failed during application of the event.

2. The processor in accordance with claim 1, wherein to apply at least one event to the partial circuit snapshot, said processor is further configured to perform a power distribution analysis on the partial circuit snapshot.

3. The processor in accordance with claim 1, wherein the graphical circuit representation includes at least one marker that identifies at least one of a location of a fault within the partial circuit snapshot and a component of the partial circuit snapshot that failed during application of the event.

4. The processor in accordance with claim 1, wherein to receive at least one input indicative of electrical circuit data, said processor is further configured to receive at least one of circuit component data that includes at least one component of the electrical circuit and circuit mapping data that includes at least one electrical connection between components in the electrical circuit.

5. The processor in accordance with claim 1, wherein to receive at least one input indicative of electrical circuit data, said processor is further configured to receive event data that includes the at least one event to be applied to the partial circuit snapshot.

6. A circuit simulator for simulating operation of a portion of an electrical circuit, said circuit simulator comprising:
a memory device;
a user input interface;
a presentation interface; and
a processor coupled to said memory device and said user input interface, said processor configured to:
receive at least one input indicative of electrical circuit data related to the electrical circuit being simulated;
generate a model of the electrical circuit based on the at least one input;
store the electrical circuit model on said memory device;
receive, from said user input interface, a user input that indicates the portion of the electrical circuit to be simulated;
generate, based on the user input and the electrical circuit model, a partial circuit snapshot that corresponds to the portion of the electrical circuit represented by the model of the electrical circuit;
generate a graphical circuit representation of the partial circuit snapshot;
display the graphical circuit representation on said presentation interface; and
apply at least one event to the partial circuit snapshot to:
simulate operation of the corresponding portion of the electrical circuit; and perform a fault analysis on the partial circuit snapshot to identify at least one component within the partial circuit snapshot that unintentionally failed during application of the event.

7. The circuit simulator in accordance with claim 6, wherein to apply at least one event to the partial circuit snapshot, said processor is further configured to perform a power distribution analysis on the partial circuit snapshot.

8. The circuit simulator in accordance with claim 6, wherein said processor comprises a data transformer configured to convert a format of the at least one input to a universal format.

9. The circuit simulator in accordance with claim 6, wherein to receive at least one input indicative of electrical circuit data, said processor is configured to receive at least one of circuit component data that includes at least one component of the electrical circuit and circuit mapping data that includes at least one electrical connection between components in the electrical circuit.

10. The circuit simulator in accordance with claim 6, wherein to receive at least one input indicative of electrical circuit data, said processor is configured to receive event data that includes the at least one event to be applied to the partial circuit snapshot.

11. The circuit simulator in accordance with claim 6, wherein the graphical circuit representation includes at least one marker that identifies at least one of a location of a fault within the partial circuit snapshot and a component of the partial circuit snapshot that failed during application of the event.

12. A method for simulating operation of at least a portion of an electrical circuit, said method comprising:
   receiving, at a processing device, at least one input indicative of electrical circuit data related to the electrical circuit being simulated;
   generating a model of the electrical circuit based on the at least one input;
   receiving, at the processing device, a user input that indicates the portion of the electrical circuit to be simulated;
   generating, based on the user input and the generated electrical circuit model, a partial circuit snapshot that corresponds to the portion of the electrical circuit represented by the model of the electrical circuit;
   generating, by the processing device, a graphical circuit representation of the partial circuit snapshot;
   displaying, by a presentation interface, the graphical circuit representation; and
   applying at least one event to the partial circuit snapshot to:
      simulate operation of the corresponding portion of the electrical circuit; and
      perform a fault analysis on the partial circuit snapshot to identify at least one component within the partial circuit snapshot that unintentionally failed during application of the event.

13. The method in accordance with claim 12, wherein applying at least one event comprises performing a power distribution analysis on the partial circuit snapshot.

14. The method in accordance with claim 12, wherein receiving at least one input comprises receiving at least one of circuit component data that includes at least one component of the electrical circuit being simulated and circuit mapping data that includes at least one electrical connection between components in the electrical circuit.

15. The method in accordance with claim 12, wherein receiving at least one input comprises receiving at least one input indicative of electrical circuit data related to an electrical power distribution system circuit.

16. The method in accordance with claim 12, wherein receiving at least one input comprises receiving event data that includes the at least one event to be applied to the partial circuit snapshot.

17. The method in accordance with claim 12, wherein the graphical circuit representation includes at least one marker that identifies at least one of a location of a fault within the partial circuit snapshot and a component of the partial circuit snapshot that failed during application of the event.

* * * * *